(12) United States Patent
Tanaka et al.

(10) Patent No.: US 8,917,520 B2
(45) Date of Patent: Dec. 23, 2014

(54) CIRCUIT SUBSTRATE (71) Applicant: Taiyo Yuden Co., Ltd., Tokyo (JP)

(72) Inventors: Sachiko Tanaka, Kanagawa (JP);
Naoyuki Tasaka, Kanagawa (JP); Gohki Nishimura, Kanagawa (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 14/226,712

(22) Filed: Mar. 26, 2014

(65) Prior Publication Data

US 2014/0204549 A1 Jul. 24, 2014

Related U.S. Application Data

(63) Continuation of application No. 13/662,982, filed on Oct. 29, 2012.

(30) Foreign Application Priority Data

Dec. 22, 2011 (JP) ................. 2011-282012

(51) Int. Cl.
*H05K 1/18* (2006.01)
*H03H 9/05* (2006.01)
*H03H 9/70* (2006.01)
*H03H 9/72* (2006.01)

(52) U.S. Cl.
CPC ............. *H05K 1/185* (2013.01); *H03H 9/0566* (2013.01); *H03H 9/706* (2013.01); *H03H 9/725* (2013.01); *H03H 9/0561* (2013.01)
USPC .......................................... 361/761; 333/193

(58) Field of Classification Search
USPC .................... 361/761, 760; 333/193
See application file for complete search history.

(56) References Cited

U.S. PATENT DOCUMENTS

| 7,795,727 | B2 | 9/2010 | Bauer et al. |
| 7,961,478 | B2 | 6/2011 | Cousin |
| 2003/0128083 | A1* | 7/2003 | Matsuta .................. 333/193 |

(Continued)

FOREIGN PATENT DOCUMENTS

| EP | 1094538 A2 | 4/2001 |
| JP | 2001-189605 A | 7/2001 |

(Continued)

OTHER PUBLICATIONS

European Search Report dated Apr. 16, 2014, in a counterpart European patent application No. 12190574.9. (Cited in the parent U.S. Appl. No. 13/662,982.).

(Continued)

*Primary Examiner* — Andargie M Aychillhum
(74) *Attorney, Agent, or Firm* — Chen Yoshimura LLP (57) ABSTRACT

A circuit substrate includes: a laminate substrate in which a conductive layer and an insulating layer are laminated; a filter chip that has an acoustic wave filter and is provided inside of the laminate substrate; and a chip component that is provided on a surface of the laminate substrate and is connected to the filter chip, at least a part of the chip component overlapping with a projected region that is a region of the filter chip projected in a thickness direction of the laminate substrate.

11 Claims, 6 Drawing Sheets

(56) References Cited

U.S. PATENT DOCUMENTS

| | | |
|---|---|---|
| 2003/0169575 A1 | 9/2003 | Ikuta et al. |
| 2005/0104685 A1 | 5/2005 | Kuroki et al. |
| 2011/0076800 A1 | 3/2011 | Hirai et al. |
| 2011/0254639 A1 | 10/2011 | Tsutsumi et al. |
| 2013/0163212 A1 | 6/2013 | Tanaka et al. |

FOREIGN PATENT DOCUMENTS

| | | |
|---|---|---|
| JP | 2001-313467 A | 11/2001 |
| JP | 2002-359327 A | 12/2002 |
| JP | 2007-273585 A | 10/2007 |
| JP | 2011-176061 A | 9/2011 |
| KR | 10-2011-0091878 A | 8/2011 |

OTHER PUBLICATIONS

European Search Report dated Apr. 16, 2014, in a counterpart European patent application No. 12190575.6. (Cited in the parent U.S. Appl. No. 13/662,982.).

Japanese Office Action dated Dec. 11, 2012, in a counterpart Japanese patent application No. 2011-282012. (Cited in the parent U.S. Appl. No. 13/662,982.).

Japanese Office Action dated Dec. 11, 2012, in a counterpart Japanese patent application No. 2011-282013. (Cited in the parent U.S. Appl. No. 13/662,982.).

Korean Office Action dated Oct. 31, 2013, in a counterpart Korean patent application No. 10-2012-150445. (Cited in the parent U.S. Appl. No. 13/662,982.).

U.S. Appl. No. 13/662,990, filed Oct. 29, 2012.

\* cited by examiner

CIRCUIT SUBSTRATE

CROSS-REFERENCE TO RELATED APPLICATION

This application is a Continuation of a pending application, U.S. application Ser. No. 13/662,982 filed on Oct. 29, 2012, which is hereby incorporated by reference in its entirety. The parent application is based upon and claims the benefit of priority of the prior Japanese Patent Application No. 2011-282012, filed on Dec. 22, 2011, the entire contents of which are incorporated herein by reference.

FIELD

A certain aspect of the present invention relates to a circuit substrate.

BACKGROUND

There is known an acoustic wave filter such as a SAW (Surface Acoustic Wave) filter or a FBAR (Film Bulk Acoustic Resonator) filter, as a filter being superior in high frequency characteristic. Downsizing of a component including an acoustic wave filter is needed as a mobile communication terminal such as a mobile phone is spread. In order to downsize a component, a circuit substrate in which an acoustic wave filter and an electronic component such as an IC (Integrated Circuit) are provided on an identical substrate is used. Japanese Patent Application Publication No. 2001-189605 discloses that a SAW filter chip is provided on an upper face of a substrate and a filter is structured with an inner interconnection line in the substrate. Japanese Patent Application Publication No. 2011-176061 discloses that a transistor and a SAW filter are provided on an upper face of a substrate.

SUMMARY OF THE INVENTION

According to an aspect of the present invention, there is provided a circuit substrate including: a laminate substrate in which a conductive layer and an insulating layer are laminated; a filter chip that has an acoustic wave filter and is provided inside of the laminate substrate; and a chip component that is provided on a surface of the laminate substrate and is connected to the filter chip, at least a part of the chip component overlapping with a projected region that is a region of the filter chip projected in a thickness direction of the laminate substrate.

In another aspect, the present invention provides a circuit substrate including: a laminate substrate in which a conductive layer and an insulating layer are laminated; a transmit filter chip and a receive filter chip that each have one or more of acoustic wave resonators, the transmit and receive filter chips being provided inside of the laminate substrate, the transmit filter chip being connected between a transmit node and a common node, the reception filter chip being connected between a receive node and the common node; and first and second chip components provided on a surface of the laminate substrate, the first chip component being connected to the common node, the second chip component being connected to one of the transmit filter chip and the receive filter chip through the transmit node or the receive node, wherein either or both of the following overlaps (a) and (b) are present: (a) the first chip component overlaps with at least one of the transmit filter chip and the receive filter chip in a plan view, (b) the second chip component overlaps with at least said one of the transmit filter chip and the receive filter chip to which the second chip component is connected in a plan view.

In another aspect, the present invention provides a circuit substrate including: a laminate substrate in which a conductive layer and an insulating layer are laminated; a filter chip having one or more of acoustic wave resonators, the filter chip being provided inside of the laminate substrate and including a transmit filter and a receive filter therein, the transmit filter being connected between a transmit node and a common node, the reception filter being connected between a receive node and the common node; and first and second chip components provided on a surface of the laminate substrate, the first chip component being connected to the common node, the second chip component being connected to one of the transmit filter and the receive filter through the transmit node or the receive node, wherein either or both of the first and second chip components overlap with the filter chip in a plan view.

In another aspect, the present invention provides a circuit substrate having a transmit filter and a receive filter, including a laminate substrate in which a conductive layer and an insulating layer are laminated; a filter chip having one or more of acoustic wave resonators, the filter chip being provided inside of the laminate substrate and including either or both of the transmit filter and the receive filter therein, the transmit filter being connected between a transmit node and a common node, the reception filter being connected between a receive node and the common node; and first and second chip components provided on a surface of the laminate substrate, the first chip component being connected to the common node, the second chip component being connected to one of the transmit filter and the receive filter through the transmit node or the receive node, wherein either or both of the first and second chip components overlap with the filter chip in a plan view.

DETAILED DESCRIPTION

With conventional technology, an interconnection line connecting an acoustic wave filter and an electronic component is long. This results in difficulty of impedance matching and increasing of noise influence. As a result, there was a case where high frequency characteristic of an acoustic wave filter was degraded. And it is difficult to sufficiently downsize a circuit substrate.

Figure 1A:
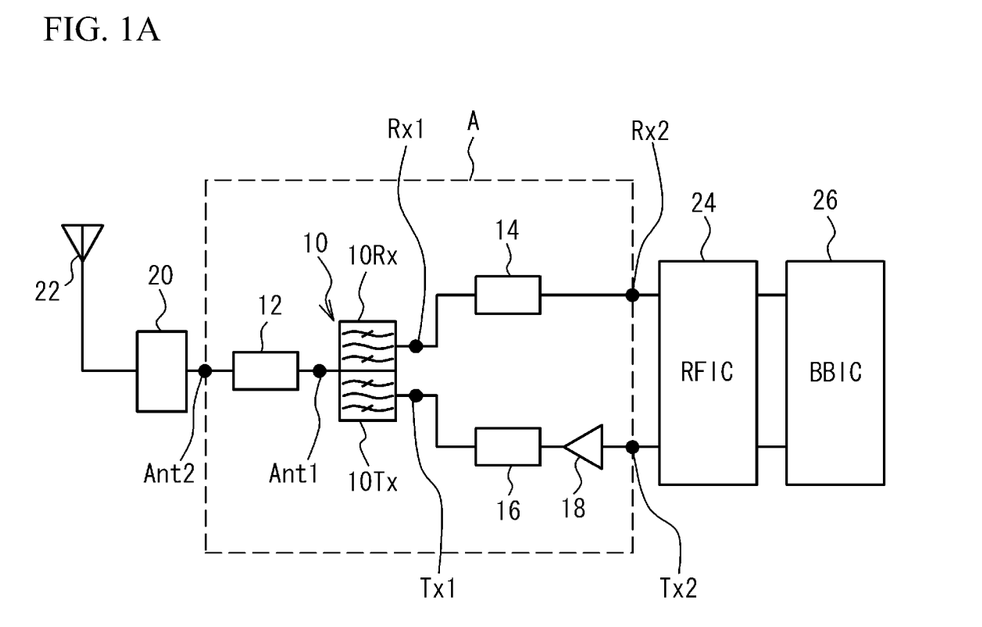
FIG. 1A illustrates a schematic view of a module including an acoustic wave filter.

First, a description will be given of a module including an acoustic wave filter. FIG. 1A illustrates a schematic view of the module including an acoustic wave filter.

As illustrated in FIG. 1A, a duplexer 10 includes a transmit filter 10Tx and a receive filter 10Rx that are SAW filters or the like. The transmit filter 10Tx is connected between an antenna node Ant1 (common node) and a transmit node Tx1. The receive filter 10Rx is connected between the antenna node Ana1 and a receive node Rx1. The transmit filter 10Tx and the receive filter 10Rx are connected with a ground terminal (not illustrated). An antenna node Ant2 is connected between a matching circuit 12 and a switch 20. A receive node Rx2 is connected between a matching circuit 14 and an RFIC (Radio Frequency Integrated Circuit) 24 (electronic component). A transmit node Tx2 is connected between a PA 18 and the RFIC 24.

A BBIC (Base Band Integrated Circuit) 26 inputs a transmit signal of a base band into the RFIC 24. The RFIC 24 up-converts the transmit signal of the base band into a transmit signal of high frequency. The transmit signal is amplified by the PA (Power Amplifier) 18, passes through a matching circuit 16, and is input into the transmit filter 10Tx. The transmit filter 10Tx allows passage of a signal having a frequency in a pass band of the transmit filter 10Tx included in the transmit signal, and suppresses a signal having a frequency out of the pass band of the transmit filter 10Tx included in the transmit signal. The switch 20 is connected with other systems having the duplexer 10, the matching circuits 12, 14 and 16, the PA 18, the RFIC 24 and the BBIC 26 (not illustrated in FIG. 1A). For example, the switch 20 selects one of the systems according to a pass band and connects the one with an antenna 22. The transmit signal is input into the antenna 22 via the matching circuit 12 and the switch 20 and is transmitted from the antenna 22. A receive signal received by the antenna 22 is input into the receive filter 10Rx via the switch 20 and the matching circuit 12. The receive filter 10Rx allows passage of a signal having a frequency in a pass band of the receive filter 10Rx included in the receive signal and suppresses a signal having a frequency out of the pass band of the receive filter 10Rx included in the receive signal. The receive signal is input into the RFIC 24 via the matching circuit 14, and is amplified by a low noise amplifier included in the RFIC 24. The RFIC 24 down-converts the receive signal into a receive signal of the base band. The BBIC 26 processes the receive signal of the base band.

The matching circuits 12, 14 and 16 include a chip component such as an inductor, a capacitor or the like, and has a function achieving impedance matching between the duplexer 10, the PA 18, the switch 20, the antenna 22, the RFIC 24 and the BBIC 26. In order to achieve adequate impedance matching, it is preferable that the matching circuits 12, 14 and 16 are arranged near the duplexer 10, and interconnection lines connecting between the matching circuits 12, 14 and 16 and the duplexer 10 are short.

Figure 1B:
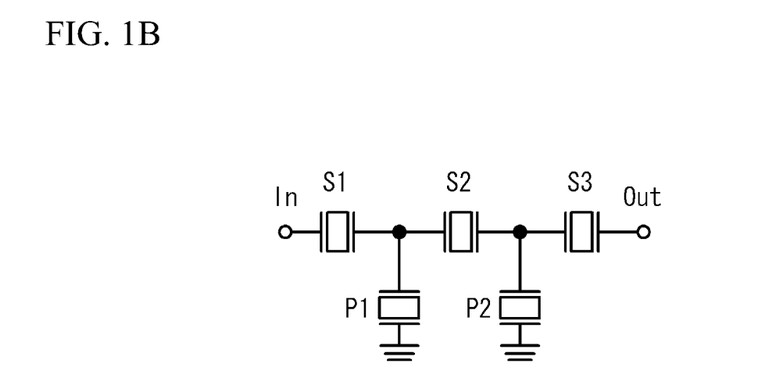
FIG. 1B illustrates a circuit diagram of a ladder type filter.

A ladder type filter or the like is used as the transmit filter 10Tx and the receive filter 10Rx. FIG. 1B illustrates a circuit diagram of a ladder type filter. Series resonators S1 through S3 are connected in series between an input terminal "In" and an output terminal "Out". A parallel resonator P1 is connected between the series resonators S1 and S2. A parallel resonator P2 is connected between the series resonators S2 and S3. The parallel resonators P1 and P2 are connected with a ground terminal. The input terminal "In" of the transmit filter 10Tx is connected with the transmit node Tx1 of FIG. 1A. The output terminal "Out" of the transmit filter 10Tx is connected with the antenna node Ant1. The input terminal "In" of the receive filter 10Rx is connected with the antenna node Ant1. The output terminal "Out" of the receive filter 10Rx is connected with the receive node Rx1. A multiple mode filter or the like other than the ladder type filter may be used as the transmit filter 10Tx and the receive filter 10Rx.

Figure 2A:
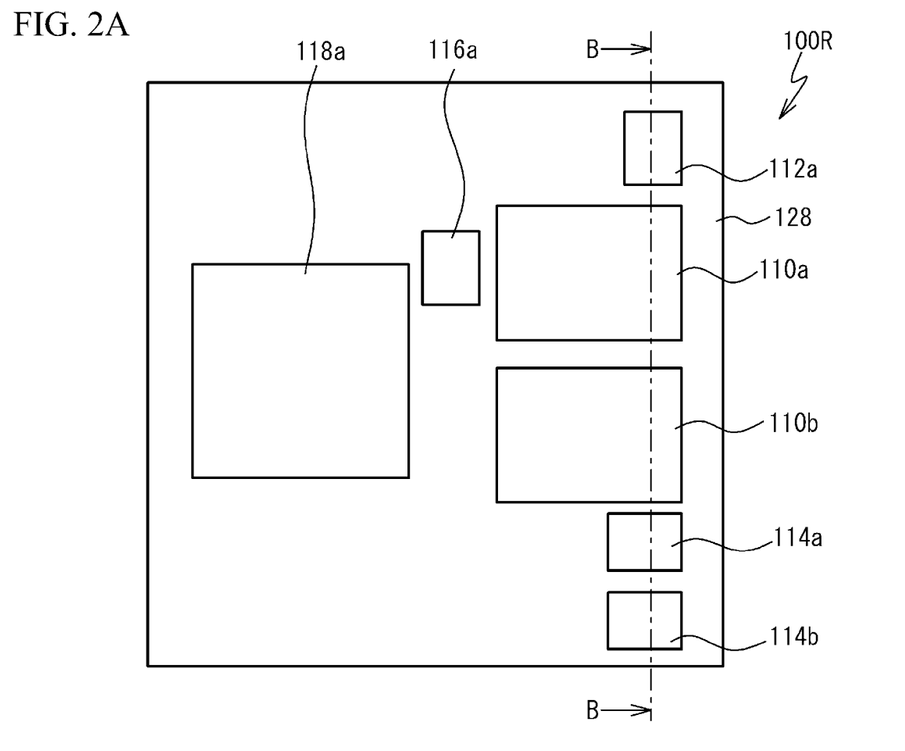
FIG. 2A illustrates a top view of a circuit substrate in accordance with a comparative example.
Figure 2B:
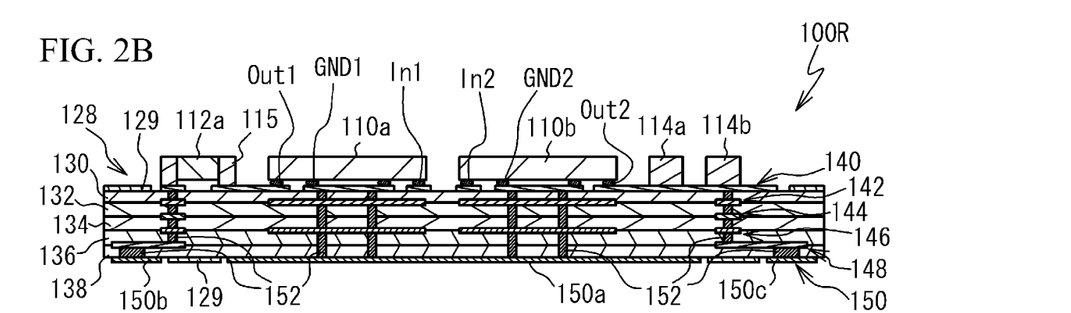
FIG. 2B illustrates a cross sectional view taken along a line B-B of FIG. 2A.

A description will be given of an example as a comparative example in which a structure surrounded by a square A in the module is provided on a single circuit substrate. FIG. 2A illustrates a top view of a circuit substrate 100R in accordance with the comparative example. FIG. 2B illustrates a cross sectional view taken along a line B-B of FIG. 2A. In FIG. 2A, a solder resist 129 and a conductive layer 140 are not illustrated. In FIG. 2B, a numeral is added to only a part of a plurality of via interconnection lines 152.

As illustrated in FIG. 2A and FIG. 2B, insulating layers 130, 132, 134, 136 and 138, the conductive layer 140 and conductive layers 142, 144, 146, 148 and 150 are laminated. Each of adjacent conductive layers is connected by the via interconnection line 152 penetrating the insulating layers 130, 132, 134, 136 and 138. The conductive layer 150 acts as a foot pad for connecting a laminate substrate 128 and an external component such as the antenna 22, the RFIC 24 or the BBIC 26. An antenna terminal 150b of the conductive layer 150 of FIG. 2B corresponds to the antenna node Ant2 of FIG. 1A. A receive terminal 150c acts as the receive node Rx2 of FIG. 1A. A transmit terminal corresponding to the transmit node Tx2 of FIG. 1A is not illustrated.

A transmit filter chip 110a is a SAW filter chip or the like including the transmit filter 10Tx of FIG. 1A. A receive filter chip 110b is a SAW filter chip or the like including the receive filter 10Rx. The matching circuit 12 of FIG. 1A includes a chip component 112a. The matching circuit 14 includes chip components 114a and 114b. The matching circuit 16 includes a chip component 116a. An active component 118a includes the PA 18.

The transmit filter chip 110a and the receive filter chip 110b are flip-chip mounted on the conductive layer 140 provided on an upper face of the laminate substrate 128. The chip components 112a, 114a, 114b and 116a are mounted on the conductive layer 140 through a solder 115. A ground terminal GND1 of the transmit filter chip 110a and a ground terminal GND2 of the receive filter chip 110b are connected with a ground terminal 150a in common. An output terminal Out1 of the transmit filter chip 110a and an input terminal In2 of the receive filter chip 110b are connected with the chip component 112a via an interconnection line included in the conductive layer 140. The chip component 112a is connected with the antenna 22 (FIG. 1A) via the antenna terminal 150b included in the conductive layer 150. An input terminal In1 of the transmit filter chip 110a is connected with the chip component 116a (FIG. 2A) via an interconnection line included in the conductive layer 140. The chip component 116a is connected with the active component 118a (FIG. 2A). The active component 118a is connected with the RFIC 24 (FIG. 1). The output terminal Out2 of the receive filter chip 110b is connected with the chip components 114a and 114b via an interconnection line included in the conductive layer 140. The chip components 114a and 114b are connected with the RFIC 24 (FIG. 1A) via the receive terminal 150c.

The filter chips (the transmit filter chip 110a and the receive filter chip 110b), the chip components 112a, 114a, 114b and 116a and the active component 118a are provided on the upper face of the laminate substrate 128. Therefore, the laminate substrate 128 gets larger. The interconnection line extending along a face direction of the laminate substrate 128 gets longer as well as the interconnection line included in the conductive layer 140, and has a length of 150 μm or more, for example. Therefore, it is difficult to achieve the impedance matching between the filter chips and the chip components 112a and 114a. And a high frequency signal passing through the interconnection line tends to be subjected to influence of an electrical noise. Thus, the high frequency characteristic of the circuit substrate 100R may be degraded. Locations of the filter chips, the chip components 112a, 114a, 114b and 116a and the active component 118a and pathways of the interconnection lines may be limited. Therefore, the interconnection lines get longer, and the high frequency characteristic may be greatly degraded. When both of the filter chips and the chip components are provided inside of the laminate substrate 128, the interconnection lines get longer because of connections of interconnection lines in the face direction. And it is difficult to change the locations of the filter chips and the chip components that have been provided inside of the laminate substrate 128 and a circuit constant (resistance value, capacitance and inductance). Therefore, it is difficult to achieve adequate impedance matching while the locations are adjusted. Next, a description will be given of a first embodiment.

[First Embodiment]

Figure 3A:
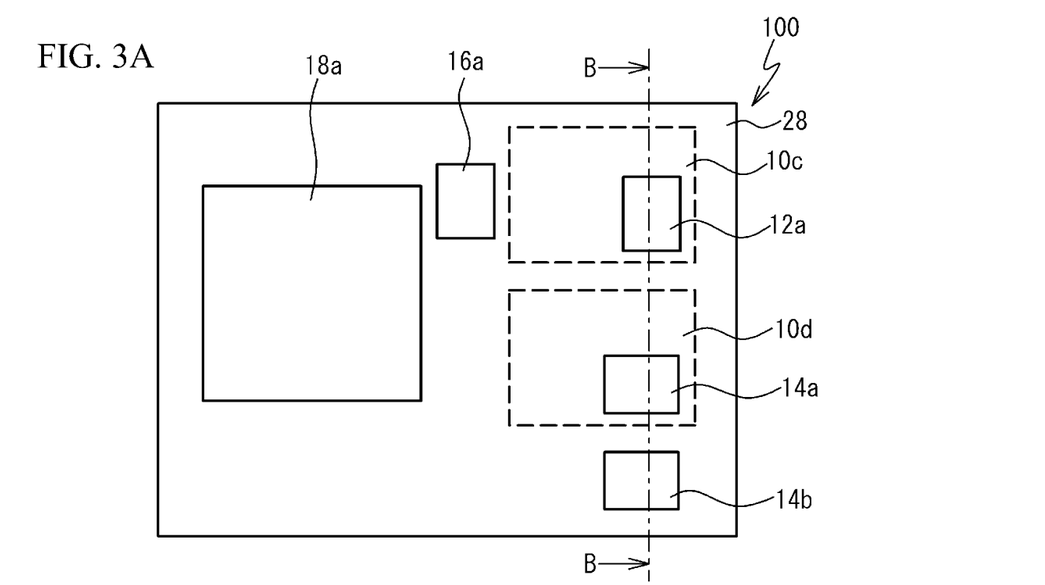
FIG. 3A illustrates a top view of a circuit substrate in accordance with a first embodiment.
Figure 3B:
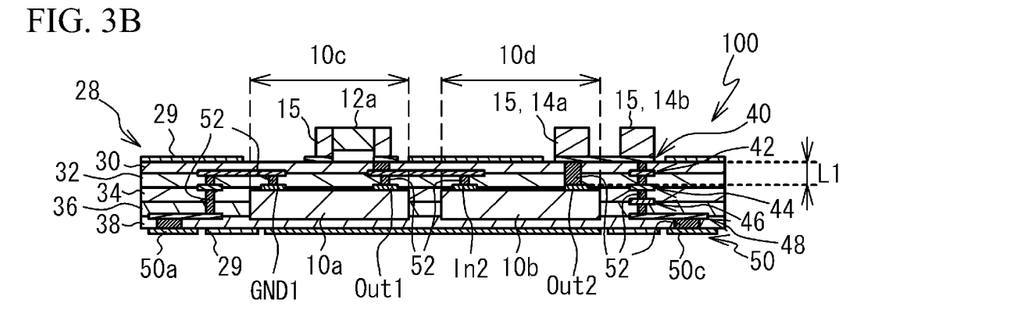
FIG. 3B illustrates a cross sectional view taken along a line B-B of FIG. 3A.

A first embodiment is an embodiment in which a filter chip is provided inside of a laminate substrate, and a chip component is mounted on an upper face (surface) of the laminate substrate. FIG. 3A illustrates a top view of a circuit substrate 100 in accordance with the first embodiment. FIG. 3B illustrates a cross sectional view taken along a line B-B of FIG. 3A.

As illustrated in FIG. 3A and FIG. 3B, a transmit filter chip 10a and a receive filter chip 10b are SAW filter chips in which an IDT (Interdigital Transducer) is formed on a piezoelectric substrate made of a piezoelectric material such as lithium tantalate (LiTaO$_3$) or lithium niobate (LiNbO$_3$), and are provided inside of a laminate substrate 28. An IDT exciting an acoustic wave is not illustrated, but is provided on the upper face of each filter chip.

Chip components 12a, 14a, 14b and 16a are mounted on the upper face of the laminate substrate 28 through a solder 15. Whole of the chip component 12a (first chip component) overlaps with a projected region 10c (first projected region, with reference to a broken line) that is a region of the transmit filter chip 10a projected in a thickness direction of the laminate substrate 28 (up and down direction of FIG. 3B). Whole of the chip component 14a (third chip component) overlaps with a projected region 10d (second projected region, with reference to a broken line) that is a region of the receive filter chip 10b projected in the thickness direction of the laminate substrate 28. Therefore, an area of the laminate substrate 28 is smaller than the comparative example. It is therefore possible to downsize the circuit substrate 100.

As illustrated in FIG. 3B, an output terminal Out1 of the transmit filter chip 10a and an input terminal In2 of the receive filter chip 10b are connected with the chip component 12a via a via interconnection line 52 and conductive layers 40 and 42. The chip component 12a is connected with an antenna terminal (not illustrated) included in a conductive layer 50. The antenna terminal corresponds to the antenna node Ant2 of FIG. 1A and is connected with the switch 20 and the antenna 22. An input terminal (not illustrated) of the transmit filter chip 10a is connected with the chip component 16a (second chip component, with reference to FIG. 3A). The chip component 16a is connected with a transmit terminal (not illustrated) included in the conductive layer 50 via an active component 18a (FIG. 3A). The transmit terminal of the conductive layer 50 corresponds to the transmit node Tx2 of FIG. 1A and is connected with the RFIC 24. The ground terminal GND1 of the transmit filter chip 10a is connected with a ground terminal 50a included in the conductive layer 50 via the conductive layers 42 and conductive layers 44, 46 and 48.

The output terminal Out2 of the receive filter chip 10b is connected with the chip component 14a via the via interconnection line 52 and the conductive layer 40. The chip component 14a is connected with a receive terminal 50c included in the conductive layer 50 via the chip component 14b and the via interconnection line 52. The receive terminal 50c corresponds to the receive node Rx2 of FIG. 1A and is connected with the RFIC 24.

The chip component 12a connected with the transmit filter chip 10a overlaps with the projected region 10c. Therefore, the interconnection line connecting the transmit filter chip 10a and the chip component 12a does not include an interconnection line extending in the face direction, and is structured with the via interconnection line 52. The interconnection line connecting the receive filter chip 10b and the chip component 14a is also structured with the via interconnection line 52. A thickness of insulating layers 30 and 32 is, for example, 30 μm or the like. A length L1 of the via interconnection line 52 connecting the receive filter chip 10b and the chip component 14a is, for example, 60 μm or the like. The interconnection line connecting the filter chip and the chip components 12a and 14a in the first embodiment is shorter than the comparative example. Thus, the impedance matching gets easier, and the influence of noise can be reduced. Further, a parasitic component such as a parasitic capacitance or a parasitic inductance of the interconnection lines is reduced. Therefore, the high frequency characteristic of the circuit substrate 100 is improved. In order to improve the high frequency characteristic effectively, it is preferable that the transmit filter chip 10a is directly connected with the chip component 12a not through another chip component, and the receive filter chip 10b is directly connected with the chip component 14a not through another chip component.

The chip components 12a, 14a, 14b and 16a are mounted on the upper face of the laminate substrate 28. It is therefore possible to achieve the impedance matching accurately and easily, while the locations of the chip components 12a, 14a, 14b and 16a and the circuit constant are adjusted. The filter chip is provided inside of the laminate substrate 28. Therefore, the freedom degree of the locations of the active component 18a, the chip components 12a, 14a, 14b and 16a and the pathways of the interconnection lines gets larger. Thus, the circuit substrate 100 can be downsized, and the interconnection line extending along the face direction can be shortened.

Figure 3C:
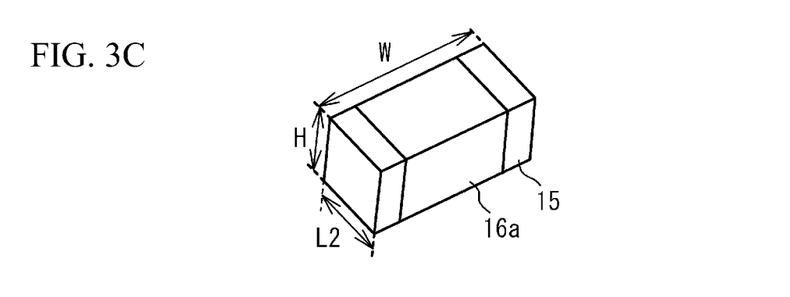
FIG. 3C illustrates a perspective view of a chip component.

FIG. 3C illustrates a perspective view of the chip component 12a. A width of the chip component 12a is, for example, 0.4 mm, 0.6 mm, or 1 mm. A length L2 of the chip component 12a is, for example, 0.2 mm, 0.3 mm, or 0.5 mm. A height of the chip component 12a is, for example, 0.3 mm. The chip components 12a, 14a, 14b and 16a may have an identical size or may have a different size from each other. The size of the chip components and the number of the chip components may be changed according to a layout on the upper face of the laminate substrate 28. A thickness of the filter chip is, for example, 250 μm. However, the thickness may be changed. The number of the insulating layers and the number of the conductive layers included in the laminate substrate 28 may be changed. The circuit substrate 100 may have at least one of or all of the switch 20, the antenna 22, the BBIC 26 and the RFIC 24 other than circuit elements surrounded by the square A of FIG. 1A.

The insulating layers 30 and 32 and insulating layers 34, 36 and 38 are made of a resin such as glass epoxy resin or a ceramics. When the insulating layers are made of resin, the housing of the filter chip gets easier. Each terminal of the filter chip and the conductive layers 42, 44, 46, 48 and 50 are made of a metal such as copper (Cu) or aluminum (Al) or an alloy including the metal. The solder 15 includes tin-silver (Sn—Ag) or the like. A solder resist 29 of FIG. 3B restrains adhesion of the solder 15 to undesirable position of the laminate substrate 28 and the conductive layer 40.

[Second Embodiment]

Figure 4A:
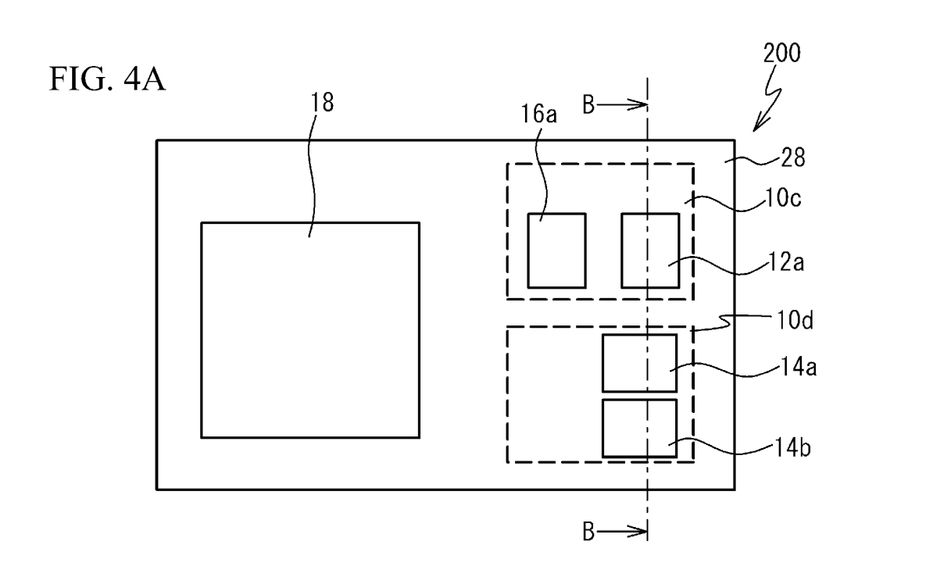
FIG. 4A illustrates a top view of a circuit substrate in accordance with a second embodiment.
Figure 4B:
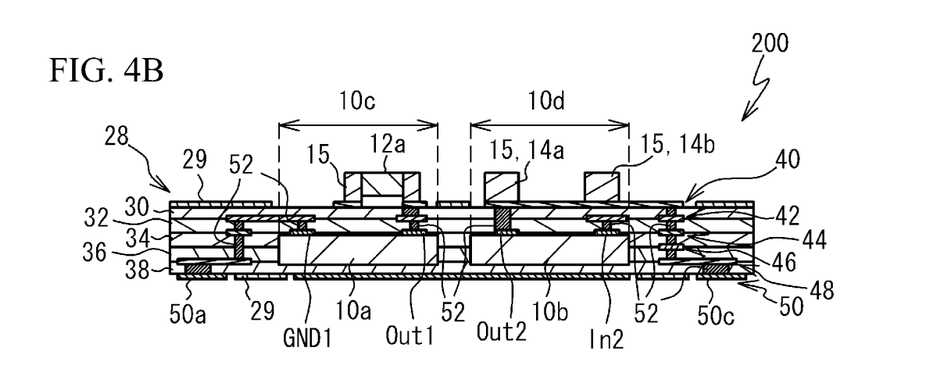
FIG. 4B illustrates a cross sectional view taken along a line B-B of FIG. 4A.

A second embodiment is an embodiment in which a plurality of chip components are provided in a single projected region. FIG. 4A illustrates a top view of a circuit substrate 200 in accordance with the second embodiment. FIG. 4B illustrates a cross sectional view taken along a line B-B of FIG. 4A.

As illustrated in FIG. 4A and FIG. 4B, whole of the chip components 12a and 16a is inside of the projected region 10c. Whole of the chip components 14a and 14b is inside of the projected region 10d. It is therefore possible to downsize the circuit substrate 200 more. The interconnection line can be shortened as well as the first embodiment. Therefore, the high frequency characteristic can be improved. The chip component 12a is directly connected with the transmit filter chip 10a. Therefore, the chip component 12a may be inside of the projected region 10c.

[Third Embodiment]

Figure 5A:
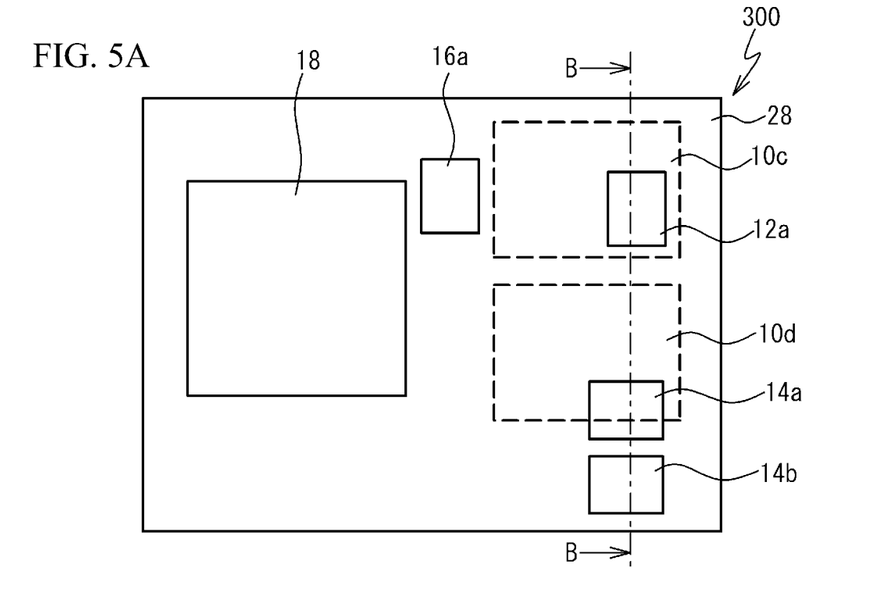
FIG. 5A illustrates a top view of a circuit substrate in accordance with a third embodiment.
Figure 5B:
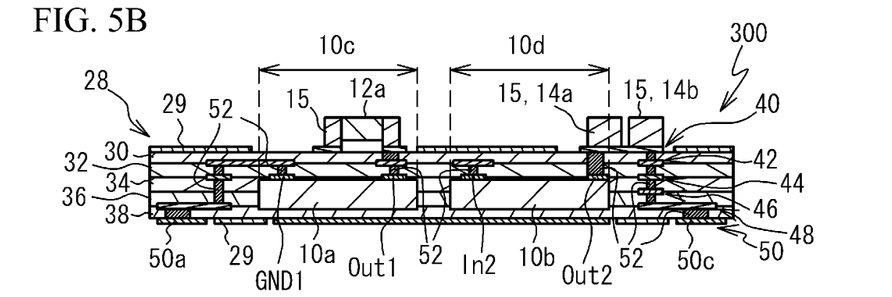
FIG. 5B illustrates a cross sectional view taken along a line-B-B of FIG. 5A.

A third embodiment is an embodiment in which a part of a chip component is provided inside of a projected region. FIG. 5A illustrates a top view of a circuit substrate 300 in accordance with a third embodiment. FIG. 5B illustrates a cross sectional view taken along a line-B-B of FIG. 5A.

As illustrated in FIG. 5A and FIG. 5B, a part of the chip component 14a is inside of the projected region 10d, and another part of the chip component 14a is outside of the projected region 10d. In accordance with the third embodiment, the circuit substrate 300 can be downsized, and the high frequency characteristic can be improved. At least a part of one of the chip components 12a, 14a, 14b and 16a has only to be inside of the projected region 10c or the projected region 10d.

Figure 5C:
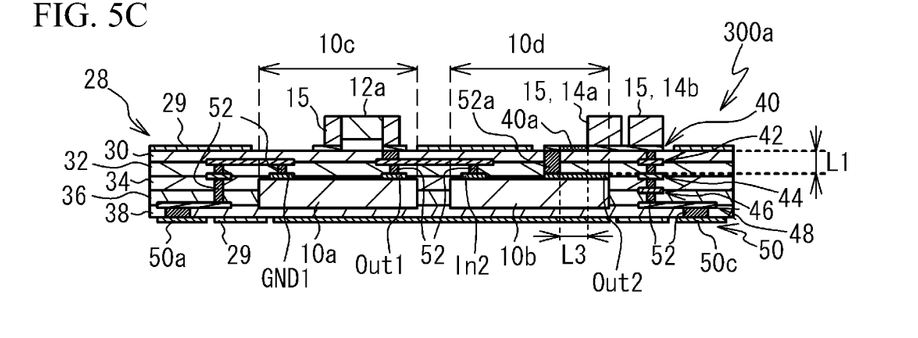
FIG. 5C illustrates a cross sectional view of a circuit substrate in accordance with a modified embodiment of the third embodiment.

FIG. 5C illustrates a cross sectional view of a circuit substrate 300a in accordance with a modified embodiment of the third embodiment. As illustrated in FIG. 5C, the receive filter chip 10b is connected with the chip component 14a via an interconnection line 40a (first interconnection line, with reference to meshed lines of FIG. 5C) included in the conductive layer 40 and a via interconnection line 52a (second interconnection line). The length L3 of the interconnection line 40a is, for example, 30 μm. The length L1 of the via interconnection line 52a is, for example, 60 μm. Even if the via interconnection line 52a is not provided so as to overlap with the chip component 14a, the high frequency characteristic can be improved, because the interconnection line 40a extending in the face direction is shorter than the via interconnection line 52a. The length of the interconnection line 40a can be changed according to the layout on the upper face of the laminate substrate 28. However, it is preferable that the interconnection line 40a is shorter than the via interconnection line 52a.

[Fourth Embodiment]

Figure 6:
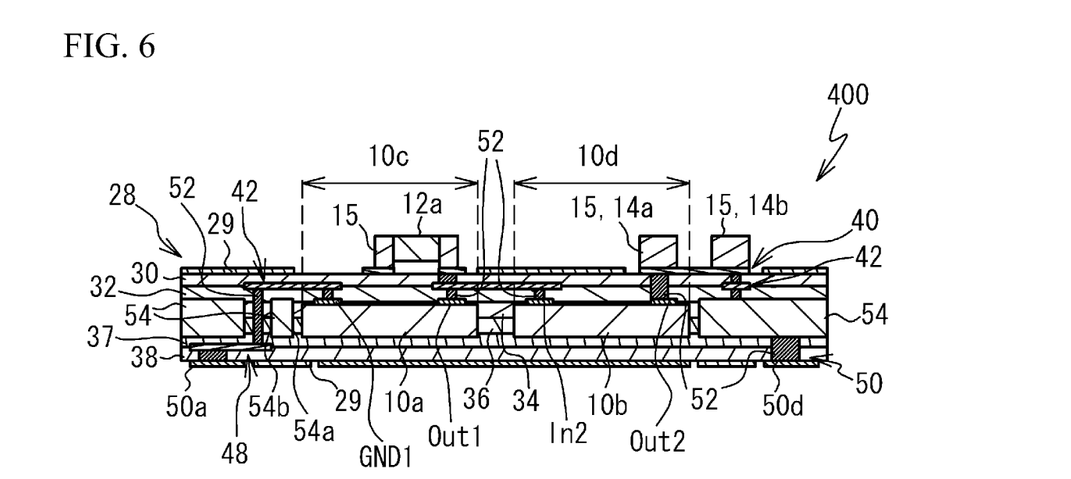
FIG. 6 illustrates a cross sectional view of a circuit substrate in accordance with a fourth embodiment.

A fourth embodiment is an embodiment in which a core is used. FIG. 6 illustrates a cross sectional view of a circuit substrate 400 in accordance with the fourth embodiment.

As illustrated in FIG. 6, the laminate substrate 28 includes a core 54 and an insulating layer 37, the insulating layer 37 being provided between the insulating layer 36 and the insulating layer 38. The core 54 has a thickness of 250 μm or the like and is made of a metal such as copper. The core 54 has a ground potential and is connected with the chip component 14b and a ground terminal 50d included in the conductive layer 50. The transmit filter chip 10a and the receive filter chip 10b are provided inside of an opening 54a of the core 54. The via interconnection line 52 connecting the conductive layer 42 and the conductive layer 48 extends to an opening 54b. The core 54 suppresses signal interference between the conductive layers 40 and 42 on the upper side of the core 54 and the conductive layers 48 and 50 on the lower side of the core 54. This results in improvement of the high frequency characteristic. The core 54 is made of a metal and is thicker than other conductive layers. Therefore, the intensity and radiation performance of the circuit substrate 400 can be improved.

In the first embodiment through the fourth embodiment, the IDT and the terminal of the filter chip may be provided on the upper face of the filter chip, or may be provided on the lower face of the filter chip. The filter chip may be another acoustic wave filter chip other than the SAW filter chip such as a boundary acoustic wave filter chip or a FBAR filter chip. A duplexer chip in which a transmit filter and a receive filter chip are provided on a single chip may be provided inside of the laminate substrate 28. In this case, a chip component is provided so that the duplexer chip overlaps with a projected region of the laminate substrate 28 projected in the thickness direction of the laminate substrate 28. The first embodiment through the fourth embodiment may be applied to an example in which a filter other than the duplexer is provided inside of the laminate substrate 28.

The present invention is not limited to the specifically described embodiments, but other embodiments and variations may be made without departing from the scope of the claimed invention.

What is claimed is:

1. A circuit substrate comprising:
   a laminate substrate in which a conductive layer and an insulating layer are laminated;
   a transmit filter chip and a receive filter chip that each have one or more of acoustic wave resonators, the transmit and receive filter chips being provided inside of the laminate substrate, the transmit filter chip being connected between a transmit node and a common node, the reception filter chip being connected between a receive node and the common node, the transmit filter chip and the receive filter chip thereby constituting a duplexer; and
   first and second chip components provided on a surface of the laminate substrate, the first chip component being connected to the common node, the second chip component being connected to one of the transmit filter chip and the receive filter chip through the transmit node or the receive node,
   wherein either or both of the following overlaps (a) and (b) are present:
   (a) the first chip component overlaps with at least one of the transmit filter chip and the receive filter chip in a plan view, (b) the second chip component overlaps with at least said one of the transmit filter chip and the receive filter chip to which the second chip component is connected in a plan view.

2. The circuit substrate according to claim 1, further comprising a third chip component connected to another of the transmit filter chip and the receive filter chip.

3. The circuit substrate according to in claim 1, wherein the first chip component overlaps with at least one of the transmit filter chip and the receive filter chip in a plan view.

4. The circuit substrate as claimed in claim 1, wherein an entirety of at least one of the first and second chip components is within where one of the transmit filter chip and the receive filter chip is formed in a plan view.

5. The circuit substrate as claimed in claim 1, wherein the first chip component is directly connected to the common node not through other chip components including the second chip component.

6. The circuit substrate as claimed in claim 1, wherein:
interconnection lines respectively connecting the first chip component and the second chip component with corresponding nodes each include a first interconnection line extending in a first direction that is parallel to the laminate substrate and a second interconnection line extending in a second direction that is perpendicular to the laminated substrate; and
the first interconnection line is shorter than the second interconnection line.

7. The circuit substrate as claimed in claim 1, wherein:
the laminate substrate includes a core made of a metal; and the transmit filter chip and the receive filter chip are provided inside of an opening formed in the core.

8. The circuit substrate as claimed in claim 1, wherein the first and second chip components are passive electronic components.

9. A circuit substrate comprising:
a laminate substrate in which a conductive layer and an insulating layer are laminated;
a filter chip having one or more of acoustic wave resonators, the filter chip being provided inside of the laminate substrate and including a transmit filter and a receive filter therein, the transmit filter being connected between a transmit node and a common node, the reception filter being connected between a receive node and the common node, the transmit filter and the receive filter in the filter chip thereby constituting a duplexer; and
first and second chip components provided on a surface of the laminate substrate, the first chip component being connected to the common node, the second chip component being connected to one of the transmit filter and the receive filter through the transmit node or the receive node,
wherein either or both of the first and second chip components overlap with the filter chip in a plan view.

10. The circuit substrate according to claim 9, further comprising a third chip component connected to another of the transmit filter and the receive filter.

11. The circuit substrate according to claim 9, wherein the first chip component overlaps with the filter chip in a plan view.

* * * * *